June 10, 1969 E. ORTNER ET AL 3,449,642

O-BEND LEAD FOR SEMICONDUCTOR PACKAGES

Filed Feb. 27, 1968

INVENTORS
ERNST ORTNER
RICHARD A. HARTMAN
BY
OSTROLENK, FABER, GERB & SOFFEN
ATTORNEYS 3,449,642

O-BEND LEAD FOR SEMICONDUCTOR PACKAGES

Ernst Ortner, Manhattan Beach, and Richard A. Hartman, Palos Verdes, Calif., assignors to International Rectifier Corporation, Los Angeles, Calif., a corporation of California Filed Feb. 27, 1968, Ser. No. 708,715
Int. Cl. H01l 5/02
U.S. Cl. 317—234 6 Claims

ABSTRACT OF THE DISCLOSURE

A lead for a semiconductor device has a central axial slot flattened to form a generally flattened opening through the lead which permits flexing of the lead without transmitting excessive strain to the semiconductor wafer to which it is connected.

This invention relates to semiconductor devices, and more particularly relates to a flexible lead structure for semi-conductor devices.

Semiconductor wafers such as thin monocrystalline silicon wafers used for semiconductor devices are brittle. Therefore, care must be taken to prevent application of excessive strains to the wafer from the leads connected thereto, due to thermal or mechanical conditions.

A commonly used lead connected to the wafer will have an "expansion loop" therein such as an S-shaped or a C-shaped bend so that the lead can flex due to dimensional changes thereof during manufacture, assembly, and in use without unduly straining the wafer. Such leads require a certain minimum height for a given material and cross-section.

In accordance with the present invention, an expansion loop is provided with a flattened O-shape, formed by a longitudinal slot in the lead which is compressed down to form two parallel arches. Since the expansion loop is formed of two arches, the required height of the loop is considerably reduced in height for a given cross-section of a given material as compared to the standard S- and C-shaped expansion loops. Moreover, a standard lead material can be used.

Another lead wire has been proposed in U.S. Patent 3,050,666 in which an opening is formed through a lead to permit yielding of the lead under stress. This arrangement reduces the available cross-section of the lead for current conduction, whereas the use of the flattened slot of the invention retains the full available conduction area, even at the region of flexing.

Accordingly, a primary object of this invention is to provide an expansion loop in a lead for semiconductor devices which requires a decreased height.

A further object of ths invention is to reduce the volume of a semiconductor device package.

Another object of this invention is to provide a novel expansion lead for a semiconductor device which can be made of a variety of materials.

These and other objects of this invention will become apparent from the following description when taken in connection with the drawings, in which.

Figures 1, 2, 3:
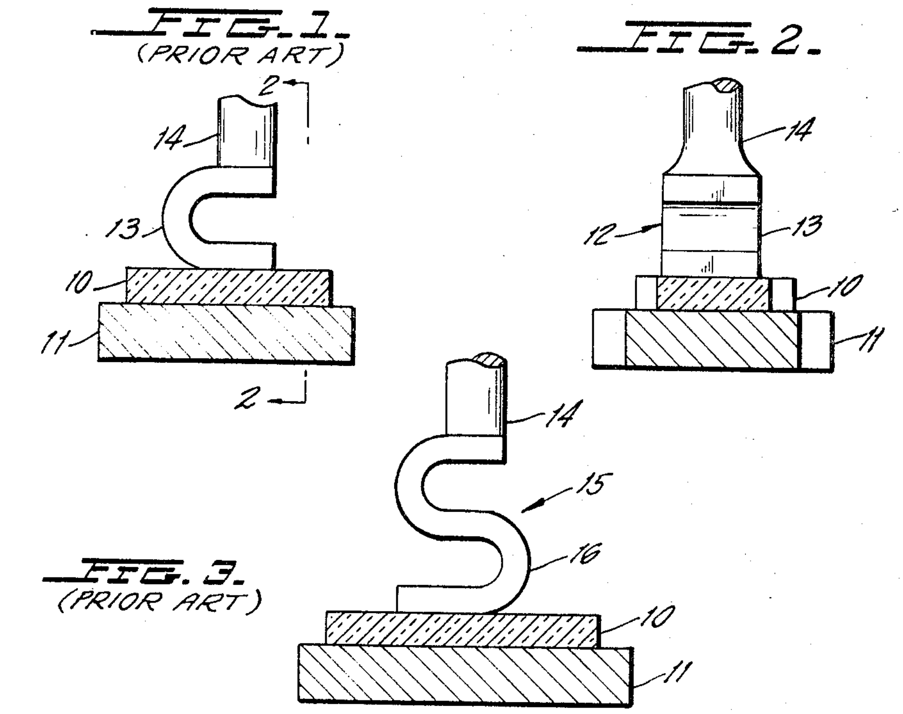
FIG. 1 (PRIOR ART), FIG. 2, FIG. 3 (PRIOR ART)
FIGURE 1 shows a prior art semiconductor device with a lead having a C-shaped expansion loop.
FIGURE 2 is a cross-sectional view of FIGURE 1 taken across section line 2—2 in FIGURE 1.
FIGURE 3 shows a prior art type S-shaped expansion loop.

Referring first to FIGURES 1 and 2, there is shown a semiconductor wafer 10 secured to a conductive base 11 in any desired manner. Wafer 10 may have one or more junctions therein formed by diffusion, alloying, or the like, to form the type of device desired, such a diode. By way of example, wafer 10 may be a square chip having a thickness of 17 mils and an area of 250 by 250 mils. The bottom of wafer 10 need not seat on base 11, but may have any desired terminal secured thereto. The upper electrode 12, connected to the top of wafer 10 is formed of a C-shaped portion 13 having a cross-section of about .013 square inch with a radius of about .045 inch, governed by the material thickness at the bend which dictates that an unfractured bend should have a radius of not less than the material thickness at the bend, and a corresponding height above the top of wafer 10 of about .180 inch. A lead 14 may be brazed to the top of C-shaped portion 13. The bottom of C-shaped portion 13 is then soldered or alloyed to the top of wafer 10. For example, portion 13 may be of aluminum to form an alloyed junction in wafer 10.

FIGURE 3 shows another prior art version of an expansion loop containing lead 15 having an S-shaped portion 16. The cross-section of portion 16 is similar to that of portion 13 of FIGURES 1 and 2, and will have a height of .315 inch.

Figure 4:
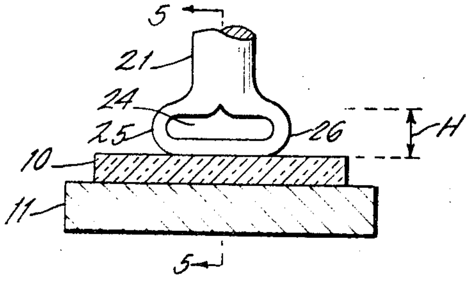
FIGURE 4 shows a semiconductor device incorporating the flattened O-shaped extension loop of the invention.
Figure 5:
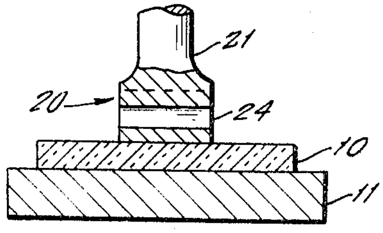
FIGURE 5 is a cross-sectional view of FIGURE 4 taken across section line 5—5 in FIGURE 4.
Figure 6:
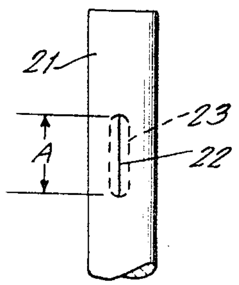
FIGURE 6 shows a lead wire in a first stage of the manufacture thereof in accordance with the invention.

In accordance with the invention, and as shown in FIGURES 4 and 5, the lead 20 is formed in a novel manner, from a standard lead wire 21 which may be of silver, copper, aluminum, or any of the other usual lead wire materials. In forming the lead, and as shown in FIGURE 6, a slot 22 is formed in wire 21, which may be a simple single cut for thin wire diameters, up to 188 mils, or a slot, shown in dotted lines 23 in FIGURE 6, having a width of 30 to 60 mils for larger wire diameters. The length A of simple slot 22 is .180 inch for a wire diameter of 128 mils. Longer slots are used for larger diameter wires.

Figure 7:
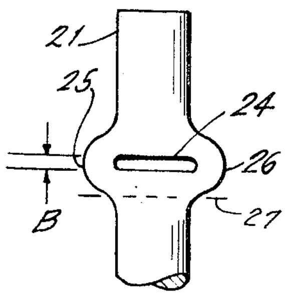
FIGURE 7 shows the lead of FIGURE 6 after flattening the slot therein.

Wire 21 is then compressed axially to flatten slot 22 to the shape 24, shown in FIGURE 7, defined by two parallel arches 25 and 26. Dimension B is about 45 mils, it being important only that the opposite surfaces of opening 24 do not touch to permit flexing in either direction. The wire 21 is then cut off at about the dotted line 27, shown in FIGURE 7, with the lead extending above slot 24 for any desired length. The base of the lead is then soldered, or otherwise connected to the top of wafer 10, as shown in FIGURES 4 and 5. Note that the expansion loop will have a height H of about 90 mils for a cross-section equivalent to the cross-section of the lead of FIGURES 1 and 3. With this smaller height, it will be apparent that the size of the package for the semiconductor device will be appreciably decreased.

As an alternate method of manufacture, a thin-walled, hollow metal tube can be flattened to the shape of parallel arches 25 and 26 and a lead portion can be fastened by welding or brazing to the outer wall of the tube.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A conductive lead wire for a semiconductor device; said lead wire having an expansion loop therein; said expansion loop formed of a flattened slot in said wire, flattened in a plane perpendicular to the axis of said wire; said flattened slot defining a pair of outwardly bowed arch portions of generally equal cross-section; the total cross-section of said pair of arch portions being approximately equal to the full cross-sectional area of said lead wire.

2. The lead wire of claim 1 wherein said lead wire has one flat end surface immediately below the bottom outer surface portions of said pair of outwardly bowed arches.

3. The lead wire of claim 1 wherein said lead wire has a circular cross-section.

4. The lead wire of claim 1 comprised of a flattened hollow metal tube defining said bowed arch portions and a wire extending from and connected to an outer surface portion of said tube.

5. In combination; a lead wire and a flat semiconductor wafer; said lead wire having an expansion loop therein; said expansion loop formed of a flattened slot in said wire, flattened in a plane perpendicular to the axis of said wire; said flattened slot defining a pair of outwardly bowed arch portions of generally equal cross-section; the total cross-section of said pair of arch portions being approximately equal to the full cross-sectional area of said lead wire; said lead wire having one flat end surface immediately below the bottom outer surface portions of said pair of outwardly bowed arches; said one end surface connected to one surface of said wafer.

6. The method of forming an expansion loop in an electrical lead wire comprising the steps of forming a slot through the center of a lead wire extending axially with said lead wire, and thereafter axially compressing said wire to bow the material thereof outwardly of one another to form a flattened slot extending perpendicularly of the axis of said wire with the opposite sides of said flattened slot spaced from one another.

References Cited

UNITED STATES PATENTS

| | | | |
|---|---|---|---|
| 2,651,009 | 9/1953 | Meyer | 317—235 |
| 2,896,134 | 7/1959 | Myer | 317—234 |
| 3,050,666 | 8/1962 | Stump | 317—234 |
| 3,196,325 | 7/1965 | Swartz | 317—234 |

JOHN W. HUCKERT, *Primary Examiner.*

S. BRODER, *Assistant Examiner.*